United States Patent
Park et al.

(10) Patent No.: US 10,073,152 B2
(45) Date of Patent: Sep. 11, 2018

(54) MAGNETIC RESONANCE IMAGING DEVICE AND MAGNETIC RESONANCE IMAGING METHOD USING THE SAME DEVICE

(71) Applicant: Korea University Research and Business Foundation, Seoul (KR)

(72) Inventors: Jaeseok Park, Seoul (KR); Hoonjae Lee, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 854 days.

(21) Appl. No.: 14/629,826

(22) Filed: Feb. 24, 2015

(65) Prior Publication Data
US 2015/0241533 A1    Aug. 27, 2015

(30) Foreign Application Priority Data
Feb. 25, 2014    (KR) .................. 10-2014-0021931

(51) Int. Cl.
| G01R 33/24  | (2006.01) |
| G01R 33/48  | (2006.01) |
| G01R 33/561 | (2006.01) |

(52) U.S. Cl.
CPC ........ G01R 33/243 (2013.01); *G01R 33/4824* (2013.01); *G01R 33/5617* (2013.01)

(58) Field of Classification Search
CPC ............. G01R 33/243; G01R 33/4824; G01R 33/5617
See application file for complete search history.

(56) References Cited

U.S. PATENT DOCUMENTS

| 4,678,996 A * | 7/1987 | Haacke ............. G01N 24/08 324/309 |
| 5,570,019 A * | 10/1996 | Moonen ............. G01R 33/4833 324/307 |
| 6,341,179 B1 * | 1/2002 | Stoyle ............. G06T 11/008 382/254 |
| 7,425,828 B2 * | 9/2008 | Garwood ............. G01N 24/10 324/310 |

(Continued)

FOREIGN PATENT DOCUMENTS

WO    2009/042881 A1    4/2009

*Primary Examiner* — Dixomara Vargas
(74) *Attorney, Agent, or Firm* — Pearne & Gordon LLP

(57) ABSTRACT

There is provided a magnetic resonance imaging device comprising: a pulse generating unit that generates a saturation pulse for reducing a signal of a water molecule within the living body and a pulse sequence after saturation time for the saturation pulse; a sampling implementing unit that implements sampling in each of a plurality of k-spaces acquired according to a repeated sequence applying the saturation pulse and the pulse sequence, and implements the sampling for a sampling area including a center portion of each of the k-spaces and a certain portion differently determined for each of the k-spaces; and an image acquiring unit that acquires a reconstructed image from the data acquired as a result of the sampling. Here, the pulse generating unit applies a saturation pulse having a different frequency per the sequence, and the sampling implementing unit acquires data for the center portion at a Nyquist rate.

11 Claims, 7 Drawing Sheets

(56) References Cited

U.S. PATENT DOCUMENTS

| | | | | |
|---|---|---|---|---|
| 7,777,484 B2* | 8/2010 | Garwood | ............... | G01N 24/10 |
| | | | | 324/307 |
| 8,067,936 B2* | 11/2011 | Garwood | ............... | G01N 24/10 |
| | | | | 324/307 |
| 8,754,644 B2* | 6/2014 | Trakic | ................ | G01R 33/422 |
| | | | | 324/307 |
| 9,733,326 B2* | 8/2017 | He | ....................... | G01R 33/485 |

* cited by examiner

SPIRAL K-SPACE TRAJECTORIES

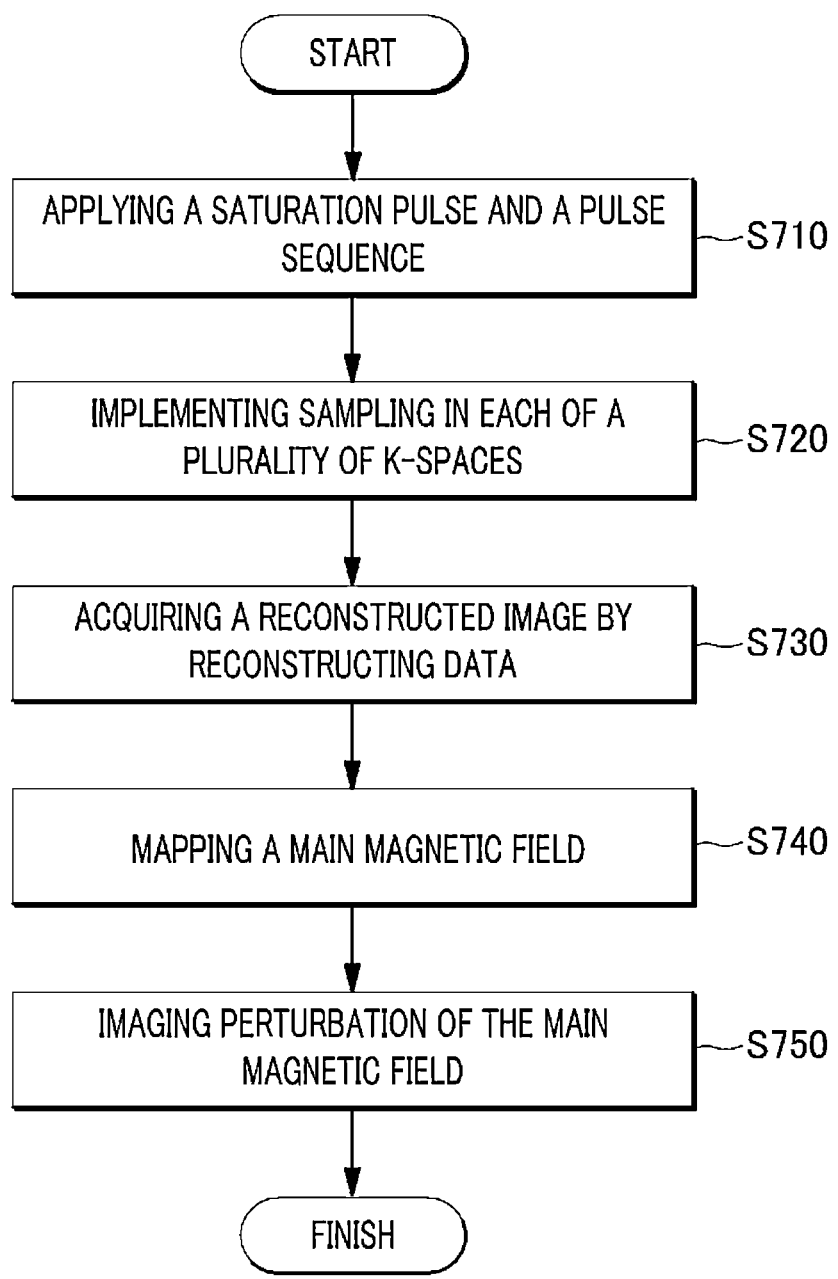

MAGNETIC RESONANCE IMAGING DEVICE AND MAGNETIC RESONANCE IMAGING METHOD USING THE SAME DEVICE

CROSS-REFERENCE TO RELATED APPLICATION

This application claims the benefit of Korean Patent Application No. 10-2014-0021931 filed on Feb. 25, 2014, the entire disclosures of which are incorporated herein by reference.

TECHNICAL FIELD

The embodiments described herein pertain generally to a magnetic resonance imaging device and a magnetic resonance imaging method using the same device.

BACKGROUND

In recent, there have been increasing cases where images of a human body in a horizontal axis direction, a longitudinal axis direction, a diagonal direction and other directions are acquired by using a magnetic resonance imaging (MRI) device, and the state of a person to be examined is examined and diagnosed through the images.

In general, in case of the magnetic resonance imaging device, a main magnetic field is applied to a measurement space, but there is a problem since an intended strength of a magnetic field (e.g., 3 tesla) is not consistently applied.

Since perturbation or variation of the main magnetic field causes artifacts in a reconstructed image, a technology that maps and corrects the main magnetic field is necessary.

The technology that corrects the main magnetic field may be divided largely by the following two (2) manners: a phase based field mapping manner; and a frequency based field mapping manner.

In case of the phase based field mapping manner, since images can be reconstructed through one sequence, there is an advantage in that the main magnetic field can be quickly corrected. However, when the phase exceeds 360° from 0°, a phase wrapping problem occurs, and a separate follow-up process to resolve the problem has been necessary.

In case of the frequency based magnetic field mapping manner, the phase wrapping problem does not occur, but there has been a problem in that since each image of multiple saturation frequencies needs to undergo one sequence, an overly long period of time for imaging is necessary.

Meanwhile, in this regard, WO 2009/042881 A1 (Title of Invention: Frequency Referencing for Chemical Exchange Saturation Transfer MRI) describes a water saturation shift referencing (WASSR) technique performed by using a magnetic resonance scanner. The water saturation shift referencing technique corrects the main magnet field based on frequency shift of a water molecule.

SUMMARY

In view of the foregoing, some of the example embodiments provide a magnetic resonance imaging device and method, which can rapidly acquire and reconstruct images without causing a phase wrapping problem.

In addition, some of the example embodiments provide a magnetic resonance imaging device and method, which can map a main magnetic field by using a saturation frequency of a water molecule within a living body, and more exactly correct an error of the mapped main magnetic field.

However, the problems sought to be solved by the present disclosure are not limited to the above description, and other problems can be clearly understood by those skilled in the art from the following description.

In one example embodiment, there is provided a magnetic resonance imaging device comprising: a pulse generating unit that generates a saturation pulse for reducing a signal of a water molecule within the living body and a pulse sequence after saturation time for the saturation pulse; a sampling implementing unit that implements sampling in each of a plurality of k-spaces acquired according to a repeated sequence applying the saturation pulse and the pulse sequence, and implements the sampling for a sampling area including a center portion of each of the k-spaces and a certain portion differently determined for each of the k-spaces; and an image acquiring unit that acquires a reconstructed image from the data acquired as a result of the sampling.

In this case, the pulse generating unit applies a saturation pulse having a different frequency per the sequence, and the sampling implementing unit acquires data for the center portion at a Nyquist rate.

In another example embodiment, there is provided a magnetic resonance imaging method comprising: repeatedly implementing a sequence applying a saturation pulse for reducing a signal of a water molecule within the living body and a pulse sequence after saturation time for the saturation pulse; implementing sampling in each of a plurality of k-spaces acquired according to the sequence, and implementing the sampling for a sampling area including a center portion of each of the k-spaces and a certain portion differently determined for each of the k-spaces; and acquiring a reconstructed image from data acquired as a result of the sampling.

In this case, the implementing of the sequence comprises applying a saturation pulse having a different frequency per the sequence, and the implementing of the sampling comprises acquiring data for the center portion at the Nyquist rate.

By using the magnetic resonance imaging device and the magnetic resonance imaging method using the same device in accordance with the example embodiments, the phase wrapping problem can be fundamentally eliminated, and the imaging time can be dramatically reduced.

In addition, there is an advantage in that the magnetic resonance imaging device and the magnetic resonance imaging method using the same device can be applied to various areas for the purpose of quickly and exactly correcting perturbation or variation of the main magnetic field.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7 is a flow chart showing a magnetic resonance imaging method in accordance with an example embodiment.

DETAILED DESCRIPTION

Figure 1:
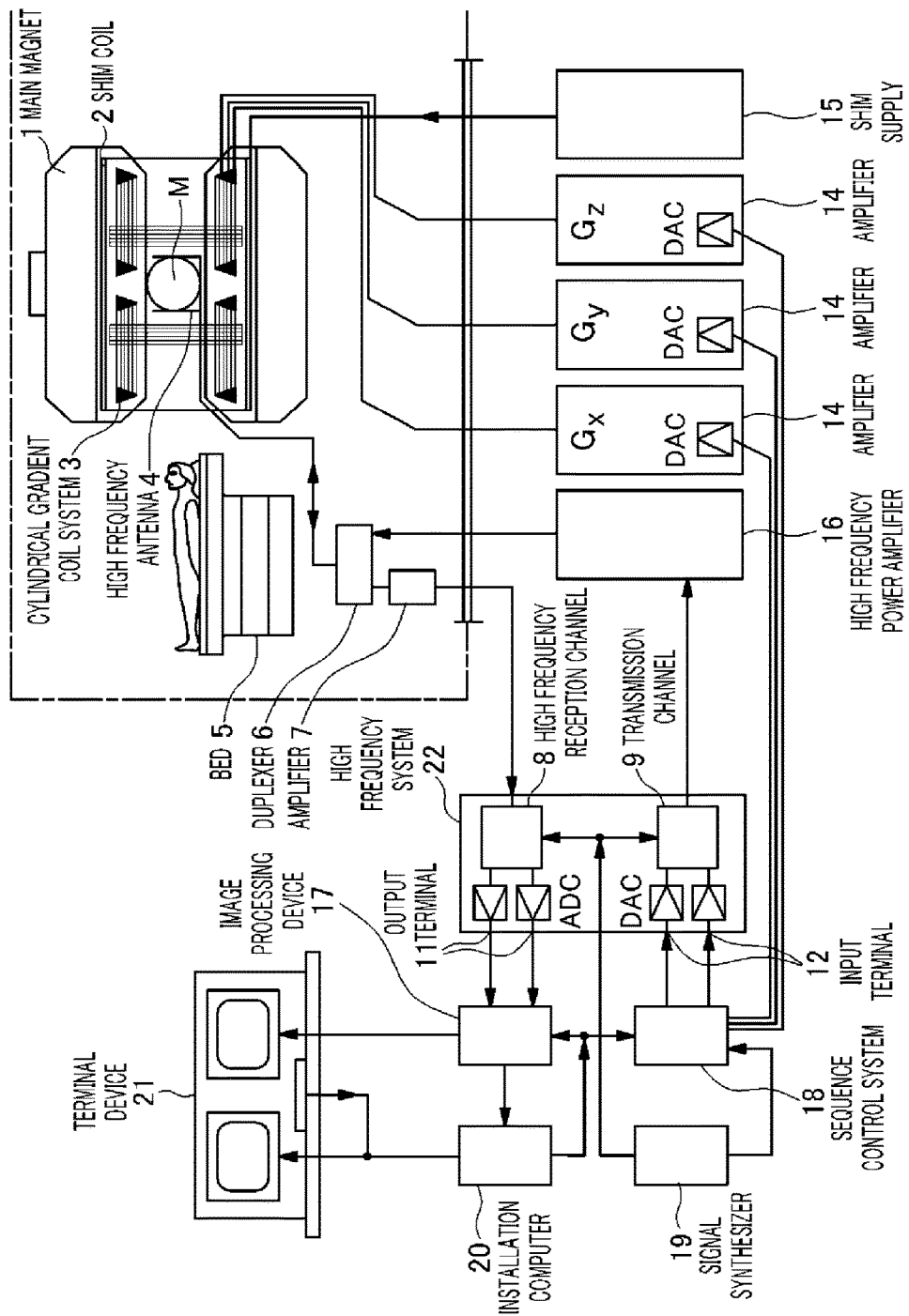
FIG. 1 is a block configuration diagram showing a magnetic resonance imaging device as a whole in accordance with an example embodiment.

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element. Further, the term "comprises or includes" and/or "comprising or including" used in the document means that one or more other components, steps, operations, and/or the existence or addition of elements are not excluded in addition to the described components, steps, operations and/or elements.

FIG. 1 is a block configuration diagram showing a magnetic resonance imaging device as a whole in accordance with an example embodiment.

Here, the magnetic resonance imaging (MRI) device uses a magnetic field and non-ionizing radiation (a radio high frequency), which are harmless to the human body, for imaging of the physical principle of the nuclear magnetic resonance (NMR), and has a substantially identical structure to that of a conventional tomography.

A main magnet 1 generates certain strength of a strong magnetic field to polarize or arrange nuclear spins within an area of an object to be examined, for example, like part of the human body to be examined. High homogeneity of the main magnet necessary for measurement of nuclear spin resonance is determined within a spherical measurement space (M), and the part of the human body to be examined enters into the measurement space (M). In this case, a shim plate formed of a so-called ferromagnetic material is provided at a proper position to satisfy the homogeneity requirement, and especially, eliminate time-invariable operations. Time-variable operations are eliminated by a shim-coil 2 driven by a shim supply 15.

A cylindrical gradient coil system 3 consisting of three (3) partial windings is inserted into the main magnet 1. The partial windings are supplied with currents by amplifiers 14, respectively, to generate a linear gradient field in individual directions of a parallel coordinate system. Here, a first partial winding of the gradient field system 3 generates gradient ($G_x$) in an x direction, a second partial winding generates gradient ($G_y$) in a y direction, and a third partial winding generates gradient ($G_z$) in a z direction. Each of the amplifiers 14 has a digital-analogue converter, which is controlled by a sequence control system 18 to generate a gradient pulse exactly on time.

A high frequency antenna 4 is provided within the gradient field system 3, and the high frequency antenna 4 converts a high frequency pulse discharged by a high frequency power amplifier 16 into an alternating field in order to excitate nuclear and arrange nuclear spins in an object to be examined or an area of an object to be examined. A nuclear spin echo signal caused by the alternating field discharged from the nuclear spins revolved by the high frequency antenna 4, i.e., a pulse sequence consisting of at least one high frequency pulse and at least one gradient pulse, is converted into voltage, and the voltage is supplied to a high frequency receiving channel 8 of a high frequency system 22 through an amplifier 7.

In addition, the high frequency system 22 includes a transmitting channel 9, and a high frequency pulse for excitation of magnetic nuclear resonance is generated within the transmitting channel 9. In this case, an individual high frequency pulse is represented as a series of complex numbers in a digital manner by a pulse sequence pre-set by an installed computer 20 within the sequence control system 18. This numeral string is a real number part and an imaginary number part, which pass their respective input terminals 12 and are supplied to the digital-analogue converter connected to the high frequency system 22, so as to be supplied from the digital-analogue converter to the transmitting channel 9. In this case, the pulse sequence within the transmitting channel 9 is modulated to a high frequency carrier signal, and a basic frequency of the high frequency carrier signal corresponds to a resonance frequency of the nuclear spins within the measurement space.

In this case, with respect to the connection between the gradient field system 3 and the high frequency system 22, the conversion from the transmitting operation by the transmitting channel 9 into the receiving operation by the high frequency receiving channel 8 is accomplished by a transmission and reception converter (Duplexer 6).

The high frequency antenna 4 radiates the high frequency pulse for excitation of the nuclear spins into the measurement space M, and implements sampling of an echo signal resulting from the radiation. A nuclear resonance signal acquired from the sampling is decoded in a phase-sensitive manner within the receiving channel 8 of the high frequency system 22, so as to be converted into a real number part and an imaginary number part of a measured signal by the individual analogue-digital converter. An image processing device 17 processes signal data that pass their respective output terminals 11 and are supplied to the image processing device 17 so as to reconstruct the data as one image.

Management of measured data, image data and a control program is implemented by the installed computer 20, and the sequence control system 18 controls generation of a certain individual pulse sequence and sampling of a corresponding k-space through pre-setting by the control program.

In this case, the sequence control system 18 controls gradient conversion according to exact time, discharge of a high frequency pulse having a set phase and amplitude, and reception of a nuclear resonance signal, and a signal synthesizer 19 provides a time base for the high frequency system 22 and the sequence control system 18. Selection of a control program suitable for generation of a nuclear spin image and display of the generated nuclear spin image are accomplished by a terminal device 21 including one keypad and at least one display.

Figure 2:
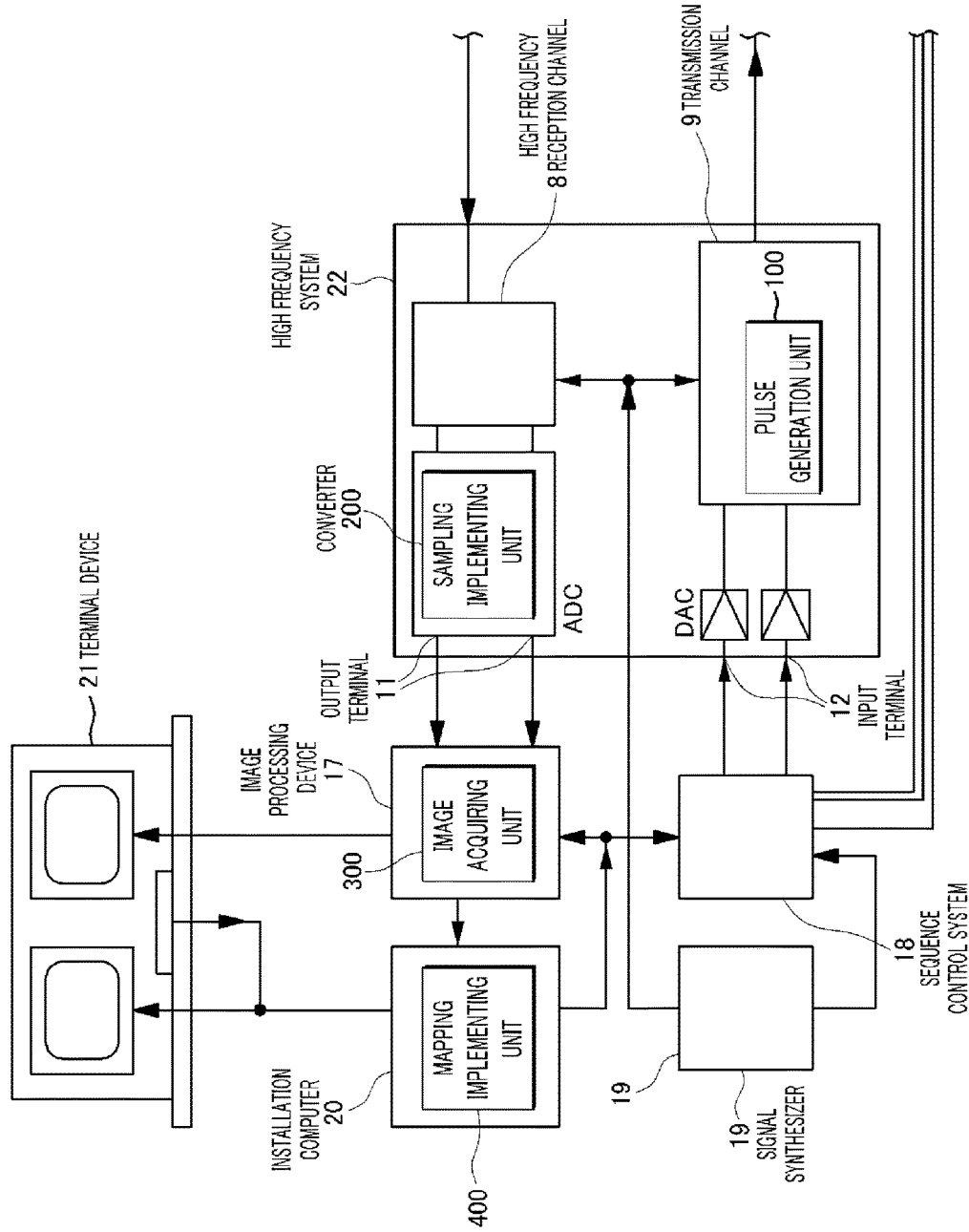
FIG. 2 is a block configuration diagram showing a magnified view of part of the configuration of FIG. 1.

Hereinafter, detailed configuration of the magnetic resonance imaging device in accordance with an example embodiment is described with reference to FIG. 2. FIG. 2 is a block configuration diagram showing a magnified view of part of the configuration of FIG. 1.

The magnetic resonance imaging device in accordance with an example embodiment includes a pulse generating unit 100, a sampling implementing unit 200, an image acquiring unit 300, and a mapping implementing unit 400, and each of the components may be embodied as illustrated in FIG. 2. However, the embodiments of the components are not limited to FIG. 2.

The pulse generating unit 100 may be embodied within the transmitting unit 9 of the magnetic resonance imaging device or connected thereto, so as to generate a saturation pulse for reducing a signal of a water molecule within the living body and a pulse sequence after saturation time for the saturation pulse and apply them to the living body.

Here, the saturation pulse is a type of an RF signal, and may extinguish the magnetized state of a proton in the water molecule within the living body to reduce a signal of the water molecule. This manner may be accomplished at a magnetization preparation stage.

In addition, the pulse sequence may be generated by various techniques, e.g., a spin echo technique or a turbo spin echo technique.

The pulse generating unit 100 may generate and apply a saturation pulse having a different frequency per repeated sequence that applies the above-described saturation pulse and pulse sequence. In this case, a frequency of each of the saturation pulses may be determined based on an expected variation amount of the main magnetic field, and the expected variation amount of the main magnetic field may be differently determined depending on performance or specification of the magnetic resonance imaging device.

Figure 3:
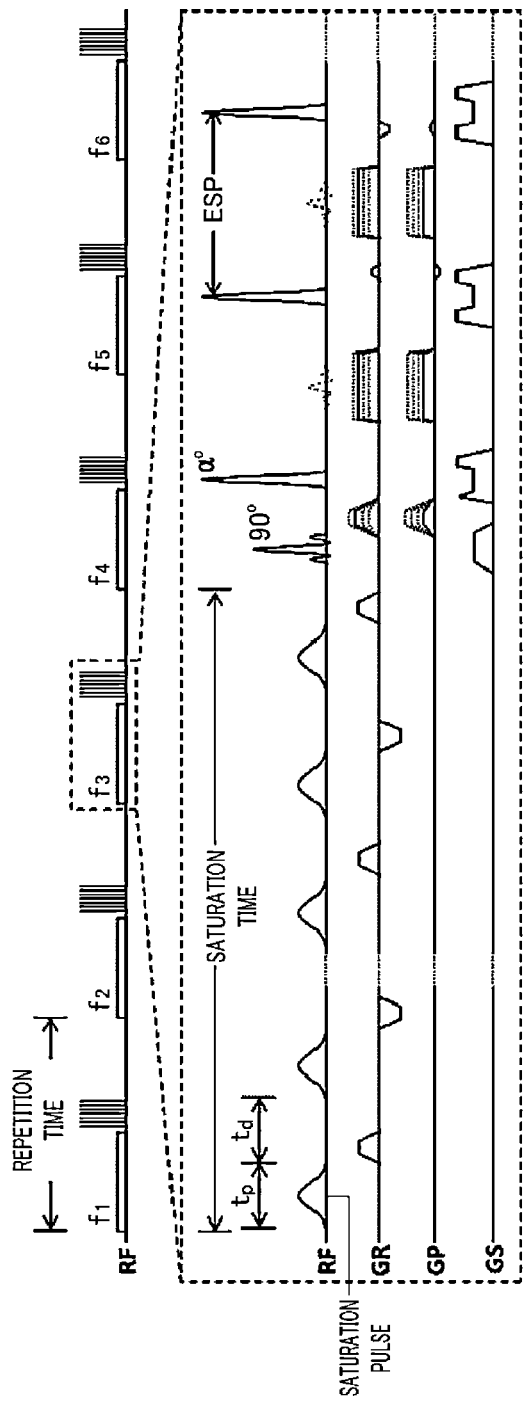
FIG. 3 shows a saturation pulse and a pulse sequence in accordance with an example embodiment.

FIG. 3 shows a saturation pulse and a pulse sequence in accordance with an example embodiment.

A saturation pulse having a frequency $f_1$ and a pulse sequence are applied in a first sequence, a saturation pulse having a frequency $f_2$ and a pulse sequence are applied in a second sequence, and a saturation pulse having a frequency $f_n$ and a pulse sequence are applied in a $n^{th}$ sequence (n=1, 2, 3 . . . ). Each of the sequences is repeatedly accomplished per repetition time.

Upon closely reviewing a $3^{rd}$ sequence, a saturation pulse having a frequency $f_3$ may be applied for saturation time, and a pulse sequence may be applied by the turbo spin echo technique even after the saturation time as illustrated in FIG. 3. The saturation time means entire time, during which the saturation pulse is intermittently or continuously applied, and more signals of the water molecule may be extinguished as the saturation time becomes longer.

In this case, the pulse generating unit 100 may continuously generate and apply a multiple number of saturation pulses having an identical frequency ($f_n$) within a certain sequence, or periodically or intermittently generate and apply a saturation pulse as illustrated in FIG. 3. In addition, magnetization during the application of the saturation pulse and the application of the pulse sequence may be maintained or vary according to occasion.

The signal acquired through each of the repeated sequences including the $3^{rd}$ sequence may be delivered to the sampling implementing unit 200, which will be described later.

The sampling implementing unit 200 may be embodied within the analogue-digital converter of the magnetic resonance imaging device or connected thereto, so as to implement sampling in each of a multiple number of k-spaces acquired according to the repeated sequence that applies the above-described saturation pulse and pulse sequence.

Especially, the sampling implementing unit 200 may restrictively implement the sampling for a sampling area including a center portion of each of the k-spaces and a certain portion differently determined for each of the k-spaces.

In this case, the sampling implementing unit 200 may acquire data for the center portion of each of the k-spaces at a Nyquist rate, and data for the above-described certain portion at the Nyquist rate or less.

The sampling area will be specifically described later.

The image acquiring unit 300 may be embodied within the image processing device 17 of the magnetic resonance imaging device or connected thereto, so as to acquire a reconstructed image from the data acquired as a result of the sampling in the sampling implementing unit 200.

The image acquiring unit 300 may restore an image by using Fourier transform, a parallel imaging technique, a compressed sensing technique or others.

Figure 4:
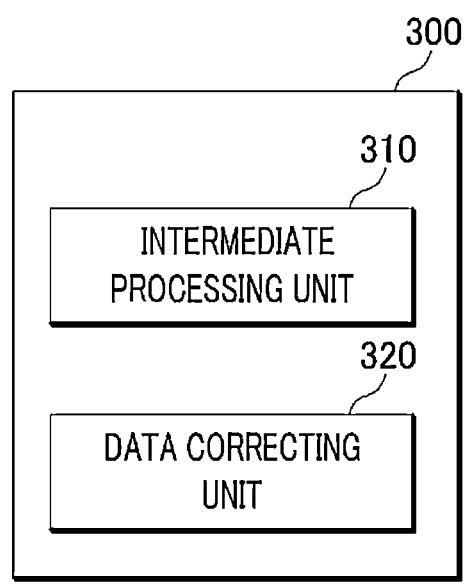
FIG. 4 is a block configuration diagram specifically showing an image acquiring unit of FIG. 2.

FIG. 4 is a block configuration diagram specifically showing the image acquiring unit of FIG. 2.

Specifically, the image acquiring unit 300 includes an intermediate processing unit 310 and a data correcting unit 320 as illustrated in FIG. 4, and may acquire a reconstructed image by the frequencies of the saturation pulses.

The intermediate processing unit 310 may weight and sum the data acquired for the center portion of each of the k-spaces among the data acquired as a result of the sampling, and share the data acquired for the above-described certain portion among the data acquired as a result of the sampling.

The intermediate processing unit 310 will be specifically described later.

The data correcting unit 320 may correct at least one of the data acquired for the above-described certain portion and the resulting data of the intermediate processing unit 310 by using the data acquired for the center portion of each of the k-spaces.

The data correcting unit 320 may implement phase correction and motion (rotation and movement) correction by using the data acquired for the center portion of each of the k-spaces, and implement an interpolation process for high speed Fourier transform when data acquisition is not accomplished in the Cartesian coordinate system.

The accuracy of the acquired data can be improved by the operation of the data correcting unit 320, and the operation of the data correcting unit 32 may vary depending on the sampling area, which will be described later.

Further, the mapping implementing unit 400 may be embodied within the installed computer 20 of the magnet resonance imaging device or connected thereto, so as to map the main magnetic field by using the reconstructed image by the frequencies of the saturation pulses, and image perturbation or variation of the main magnetic field. That is, the mapping implementing unit 400 may trace back to a resonance frequency of the water molecule within the living body that has varied by the main magnetic field, through the image encoded by the frequencies of the saturation pulses, and as a result, map the main magnetic field.

Accordingly, the magnetic resonance imaging device including the mapping implementing unit 400 as suggested in the example embodiments may be applied to any areas where an error may occur due to variation of the main magnetic field. Representatively, an error may occur in a water-fat separation image, mapping of an RF pulse, chemical exchange saturation transfer and others, and in order to correct the error, the mapping implementing unit 400 may be used.

Hereinafter, the operations of the sampling implementing unit 200 and the image acquiring unit 300 are specifically described with reference to FIG. 5 and FIG. 6.

Figure 5:
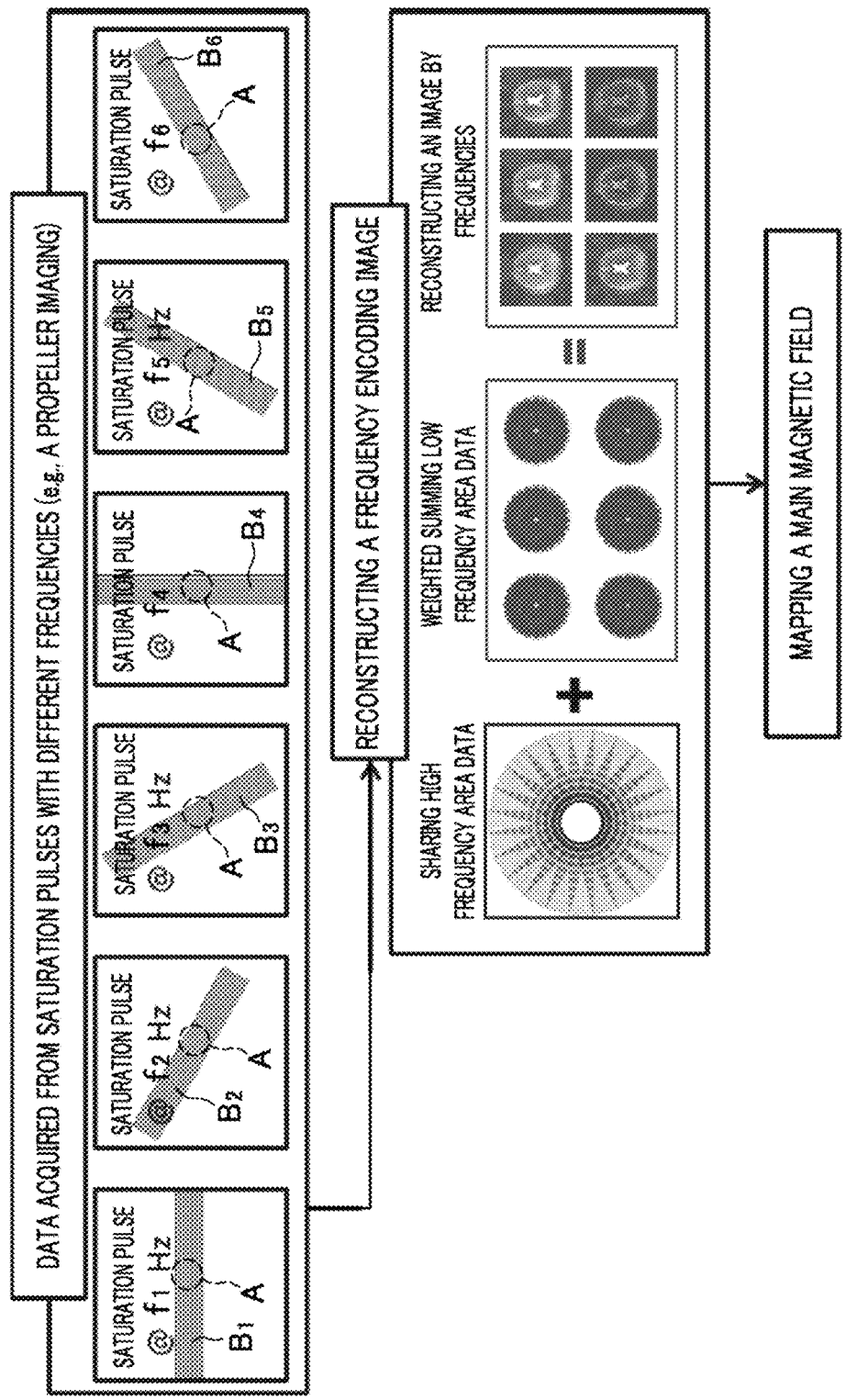
FIG. 5 shows a series of processes that implement sampling and acquire a reconstructed image in accordance with an example embodiment.
Figure 6:
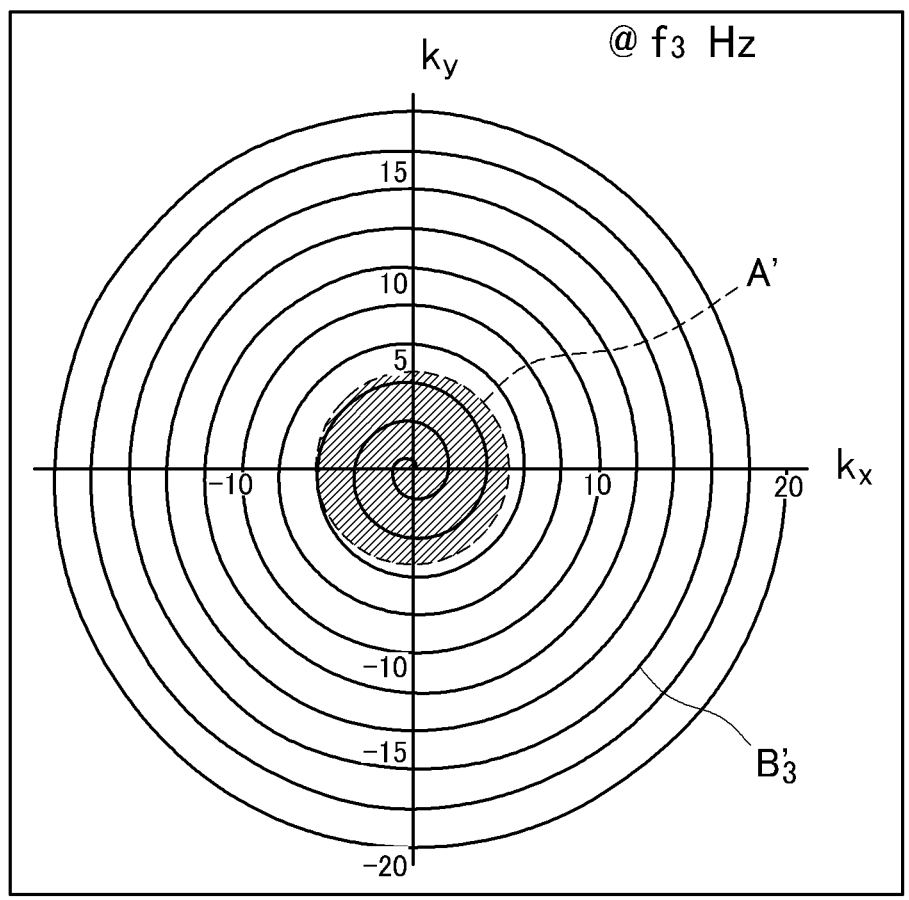
FIG. 6 shows sampling in accordance with another example embodiment.

FIG. 5 shows a series of processes for implementing sampling and acquiring a reconstructed image, and FIG. 6 shows sampling in accordance with another example embodiment.

As described above, the sampling implementing unit 200 implements sampling in each of the multiple number of the k-spaces acquired according to the repeated sequence that applies the saturation pulse and the pulse sequence, and may restrictively implement the sampling for a sampling area including a center portion of each of the k-spaces and a certain portion differently determined for each of the k-spaces.

That is, a multiple number of k-spaces may be acquired according to the repeated sequences that apply saturation pulses having different frequencies and pulse sequences.

The sampling area in the example embodiments includes the center portion of each of the k-spaces and the certain portion differently determined for each of the k-spaces.

For example, the sampling area may be of a blade shape as shown in FIG. 5.

A first k-space is acquired according to a first sequence that applies a saturation pulse having a frequency $f_1$ and a pulse sequence, and the sampling implementing unit 200 may implement sampling in the first k-space according to a first blade shape (the direction of 3 o'clock and 9 o'clock). The sampling area includes a center portion A and a peripheral portion $B_1$ of the first k-space.

A second k-space is acquired according to a second sequence that applies a saturation pulse having a frequency $f_2$ and a pulse sequence, and the sampling implementing unit 200 may implement sampling in the second k-space according to a second blade shape (the direction of 4 o'clock and 10 o'clock). The sampling area includes a center portion A and a peripheral portion $B_2$ of the second k-space.

A third k-space is acquired according to a third sequence that applies a saturation pulse having a frequency $f_3$ and a pulse sequence, and the sampling implementing unit 200 may implement sampling in a third k-space according to a third blade shape (the direction of 5 o'clock and 10 o'clock). The sampling area includes a center portion A and a peripheral portion $B_3$ of the third k-space.

In case of fourth and sixth sequences, like the first to third sequences, the sampling process is also implemented by the propeller technique. It can be identified that the center portions A overlap with one another, and the peripheral portions $B_1$, $B_2$, $B_3$, $B_4$, $B_5$ and $B_6$ are differently determined depending on the k-spaces.

In addition, the sampling area may be of a spiral shape as in FIG. 6.

A third k-space is acquired according to a third sequence that applies a saturation pulse having a frequency $f_3$ and a pulse sequence, and the sampling implementing unit 200 may implement sampling in a third k-space according to the spiral shape. The sampling area includes a center portion A' and a peripheral portion $B'_3$ of the third k-space.

In case of the other sequences, the sampling process is also implemented according to the spiral shape like the third sequence. It can be identified that the center portions A' overlap with one another, and the peripheral portions $B'_1$, $B'_2$, $B'_3$, $B'_4$, $B'_5$, and $B'_6$ are differently determined depending on the k-spaces.

Although not illustrated in the drawings, the sampling area may be of a radial or random shape, and is not limited to the shape. That is, any sampling area can become the sampling area of the example embodiments if it includes a center portion of each of the k-spaces and a certain portion differently determined for each of the k-spaces.

Since a frequency encoding gradient and a phase encoding gradient generally become small toward the center portion of the k-space, signal strength is high, and a signal of a corresponding low frequency band is mostly involved in contrast of the reconstructed image.

On the other hand, since an encoding gradient is large at the peripheral portion of the k-space, signal strength is low, a signal of a corresponding high frequency band is mostly involved in position information and details of the reconstructed image.

In consideration of these points, the sampling implementing unit 200 may acquire data for the center portion of each of the k-spaces at the Nyquist rate, and data for the above-described certain portion at the Nyquist rate or less.

The acquired data are delivered from the sampling implementing unit 200 to the image acquiring unit 300. The intermediate processing unit 310 of the image acquiring unit 300 may weight the data acquired for the center portion of each of the k-spaces among the data acquired as a result of the sampling, and share the data acquired for the above-described certain portion among the data acquired as a result of the sampling. The data correcting unit 320 of the image acquiring unit 300 may correct various data by using the data acquired for the center portion of each of the k-spaces.

Especially, in the example embodiments, by sharing the data acquired for the above-described certain portion, it is possible to obtain a substantially identical effect to that obtained from implementing sampling for the whole peripheral portion of each of the k-spaces.

That is, the example embodiments restrictively implement the sampling and acquire data for the certain portion differently determined for each of the k-spaces at the Nyquist rate or less, but can supplement a deficient portion through weighted summation, sharing (combination) and correcting processes and others.

Accordingly, by using the magnetic resonance imaging device suggested in the example embodiments, the phase wrapping problem can be fundamentally eliminated, and the imaging time can be dramatically reduced. Further, the magnetic resonance imaging device can be applied to various areas for the purpose of quickly and exactly correcting perturbation or variation of the main magnetic field.

Meanwhile, a method for acquiring a magnetic resonance image in accordance with an example embodiment is described with reference to FIG. 7.

FIG. 7 is a flow chart showing a magnetic resonance imaging method in accordance with an example embodiment.

The magnetic resonance imaging method using the magnetic resonance imaging device in accordance with an example embodiment repeatedly implements a sequence that applies a saturation pulse for reducing a signal of a water molecule within the living body and a pulse sequence after saturation time for the saturation pulse (S710).

In this case, a saturation pulse having a different frequency per the repeated sequence that applies the saturation pulse and the pulse sequence is applied toward the living body. In addition, the stage (S710) of implementing the sequence may continuously or periodically apply a multiple number of saturation pulses having an identical frequency within a random sequence.

Subsequently, sampling is implemented in each of a multiple number of k-spaces acquired from the repeated sequence that applies the saturation pulse and the pulse sequence.

Especially, in the example embodiments, sampling is restrictively implemented for a sampling area including a center portion of each of the k-spaces and a certain portion differently determined for each of the k-spaces (S720). In addition, the stage (S720) of implementing the sampling acquires data for the center portion of each of the k-spaces at the Nyquist rate.

Next, in the example embodiments, a reconstructed image is acquired from the data acquired as a result of implementing the sampling (S730).

Specifically, the stage (S730) of acquiring a reconstructed image may include weighted summing the data acquired for the center portion of each of the k-spaces among the data acquired as a result of the sampling, and sharing the data acquired for the certain portion of each of the k-spaces among the acquired data. In addition, a reconstructed image by the frequencies of the saturation pulses may be acquired based on the resulting data of the weighting stage and the resulting data of the sharing stage.

More specifically, the stage (S730) of acquiring a reconstructed image may include correcting at least one of the data acquired for the certain portion of each of the k-spaces and the resulting data of the sharing stage by using the data acquired for the center portion of each of the k-spaces.

Subsequently, in the example embodiments, the main magnetic field is mapped by using the reconstructed image (S740), and perturbation of the main magnetic field is imaged (S750).

By using the magnetic resonance imaging method in accordance with an example embodiment that has been described, the phase wrapping problem can be fundamentally eliminated, and the imaging time can be dramatically reduced. Further, the magnetic resonance imaging method can be applied to various areas for the purpose of quickly and rapidly correcting perturbation or variation of the main magnetic field.

For reference, the components illustrated in FIG. 2 and FIG. 4 in accordance with an example embodiment may imply software or hardware such as a field programmable gate array (FPGA) or an application specific integrated circuit (ASIC), and carry out predetermined functions.

However, the "components" are not limited to the software or the hardware, and each of the components may be stored in an addressable storage medium or may be configured to implement one or more processors.

Accordingly, the components may include, for example, software, object-oriented software, classes, tasks, processes, functions, attributes, procedures, sub-routines, segments of program codes, drivers, firmware, micro codes, circuits, data, database, data structures, tables, arrays, variables and the like.

The components and functions thereof can be combined with each other or can be divided.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example embodiments. It shall be understood that all modifications and embodiments conceived from the meaning and scope of the claims and their equivalents are included in the scope of the inventive concept.

We claim:

1. A magnetic resonance imaging device, comprising:
   a pulse generating unit that generates a saturation pulse for reducing a signal of a water molecule within the living body and a pulse sequence after saturation time for the saturation pulse;
   a sampling implementing unit that implements sampling in each of a plurality of k-spaces acquired according to a repeated sequence applying the saturation pulse and the pulse sequence, and implements the sampling for a sampling area including a center portion of each of the k-spaces and a certain portion differently determined for each of the k-spaces; and
   an image acquiring unit that acquires a reconstructed image from the data acquired as a result of the sampling,
   wherein the pulse generating unit applies a saturation pulse having a different frequency per the sequence, and
   the sampling implementing unit acquires data for the center portion at a Nyquist rate and acquires data for the certain portion at a rate lower than the Nyquist rate.

2. The magnetic resonance imaging device of claim 1, wherein the image acquiring unit comprises:
   an intermediate processing unit that weights and sums the data acquired for the center portion among the acquired data, and shares the data acquired for the certain portion among the acquired data; and
   a data correcting unit that corrects at least one of the data acquired for the certain portion and the resulting data of the intermediate processing unit by using the data acquired for the center portion, and
   a reconstructed image by the frequency of the saturation pulse is acquired.

3. The magnetic resonance imaging device of claim 1, further comprising a mapping implementing unit that maps the main magnetic field by using the reconstructed image and images perturbation of the main magnetic field.

4. The magnetic resonance imaging device of claim 1, wherein the frequency of the saturation pulse is determined based on an expected variation amount of the main magnetic field determined differently depending on the magnetic resonance imaging device.

5. The magnetic resonance imaging device of claim 1, wherein the pulse generating unit continuously or periodically generates a plurality of saturation pulses having an identical frequency within a random sequence.

6. The magnetic resonance imaging device of claim 1, wherein the sampling area is of a blade, spiral, radial or random shape.

7. A magnetic resonance imaging method, comprising:
repeatedly implementing a sequence applying a saturation pulse for reducing a signal of a water molecule within the living body and a pulse sequence after saturation time for the saturation pulse;
implementing sampling in each of a plurality of k-spaces acquired according to the sequence, and implementing the sampling for a sampling area including a center portion of each of the k-spaces and a certain portion differently determined for each of the k-spaces; and
acquiring a reconstructed image from data acquired as a result of the sampling,
wherein the implementing of the sequence comprises applying a saturation pulse having a different frequency per the sequence, and
the implementing of the sampling comprises acquiring data for the center portion at the Nyquist rate acquiring data for the certain portion at a rate lower than the Nyquist rate.

8. The magnetic resonance imaging method of claim 7, wherein the acquiring of the reconstructed image comprises:
weighted summing the data acquired for the center portion among the acquired data; and sharing the data acquired for the certain portion among the acquired data, and a reconstructed image by the frequency of the saturation pulse is acquired based on the resulting data of the weighted summing stage and the resulting data of the sharing stage.

9. The magnetic resonance imaging method of claim 8, wherein the acquiring of the reconstructed image further comprises correcting at least one of the data acquired for the certain portion and the resulting data of the sharing stage by using the data acquired for the center portion.

10. The magnetic resonance imaging method of claim 7, further comprising mapping a main magnetic field by using the reconstructed image; and
imaging perturbation of the main magnetic field.

11. The magnetic resonance imaging method of claim 7, wherein the implementing of the sequence continuously or periodically applies a plurality of saturation pulses having an identical frequency within a random sequence.

* * * * *